(12) United States Patent  (10) Patent No.: US 8,847,672 B2
Prabhakar, III et al.  (45) Date of Patent: Sep. 30, 2014

(54) SWITCHING DEVICE WITH RESISTIVE DIVIDER

(71) Applicant: TriQuint Semiconductor, Inc., Hillsboro, OR (US)

(72) Inventors: Ravishankar Prabhakar, III, Maitland, FL (US); James P. Furino, Jr., Melbourne, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 13/742,086

(22) Filed: Jan. 15, 2013

(65) Prior Publication Data

US 2014/0197882 A1  Jul. 17, 2014

(51) Int. Cl.
*H03K 17/687* (2006.01)
*H01L 23/00* (2006.01)
*G05F 3/02* (2006.01)

(52) U.S. Cl.
CPC . *G05F 3/02* (2013.01); *H01L 24/00* (2013.01)
USPC .......................................... 327/537; 327/434

(58) Field of Classification Search
None
See application file for complete search history.

(56) References Cited

U.S. PATENT DOCUMENTS

| | | |
|---|---|---|
| 3,551,788 A | 12/1970 | Summer |
| 3,699,359 A | 10/1972 | Shelby |
| 4,053,916 A | 10/1977 | Cricchi et al. |
| 4,316,101 A | 2/1982 | Minner |
| 4,491,750 A | 1/1985 | Janutka |
| 5,012,123 A | 4/1991 | Ayasli et al. |
| 5,146,178 A | 9/1992 | Nojima et al. |
| 5,313,083 A | 5/1994 | Schindler |
| 5,416,043 A | 5/1995 | Burgener et al. |
| 5,492,857 A | 2/1996 | Reedy et al. |
| 5,548,239 A | 8/1996 | Kohama |
| 5,553,295 A | 9/1996 | Pantelakis et al. |
| 5,572,040 A | 11/1996 | Reedy et al. |
| 5,596,205 A | 1/1997 | Reedy et al. |
| 5,600,169 A | 2/1997 | Burgener et al. |
| 5,663,570 A | 9/1997 | Reedy et al. |
| 5,777,530 A | 7/1998 | Nakatuka |
| 5,801,577 A | 9/1998 | Tailliet |
| 5,818,099 A | 10/1998 | Burghartz |
| 5,861,336 A | 1/1999 | Reedy et al. |

(Continued)

FOREIGN PATENT DOCUMENTS

CN  1256521  6/2000
EP  0385641  9/1990

(Continued)

OTHER PUBLICATIONS

Assaderaghi, et al.; "Dynamic Threshold-Voltage MOSFET (DTMOS) for Ultra-Low Voltage VLSI;" IEEE. vol. 44; No. 3; 414-421; Mar. 1997.

(Continued)

*Primary Examiner* — Lincoln Donovan
*Assistant Examiner* — Terry L Englund
(74) *Attorney, Agent, or Firm* — Schwabe Williamson & Wyatt

(57) ABSTRACT

Embodiments provide a switching device including one or more field-effect transistors (FETs). In embodiments, a resistive divider comprising a first resistor and a second resistor may be coupled with the FET at a position electrically between a gate terminal of the FET and a body terminal of the FET.

27 Claims, 5 Drawing Sheets

(56) References Cited

U.S. PATENT DOCUMENTS

| | | | |
|---|---|---|---|
| 5,863,823 A | 1/1999 | Burgener | |
| 5,883,396 A | 3/1999 | Reedy et al. | |
| 5,895,957 A | 4/1999 | Reedy et al. | |
| 5,920,233 A | 7/1999 | Denny | |
| 5,930,638 A | 7/1999 | Reedy et al. | |
| 5,945,867 A | 8/1999 | Uda et al. | |
| 5,973,363 A | 10/1999 | Staab et al. | |
| 5,973,382 A | 10/1999 | Burgener et al. | |
| 6,057,555 A | 5/2000 | Reedy et al. | |
| 6,066,993 A | 5/2000 | Yamamoto et al. | |
| 6,160,292 A | 12/2000 | Flaker et al. | |
| 6,173,235 B1 | 1/2001 | Maeda | |
| 6,249,027 B1 | 6/2001 | Burr | |
| 6,308,047 B1 | 10/2001 | Yamamoto et al. | |
| 6,452,232 B1 | 9/2002 | Adan | |
| 6,504,212 B1 | 1/2003 | Allen et al. | |
| 6,563,366 B1 | 5/2003 | Kohama | |
| 6,631,505 B2 | 10/2003 | Arai | |
| 6,632,724 B2 | 10/2003 | Henley et al. | |
| RE38,319 E * | 11/2003 | Lin et al. | 327/313 |
| 6,642,578 B1 | 11/2003 | Arnold et al. | |
| 6,693,326 B2 | 2/2004 | Adan | |
| 6,790,747 B2 | 9/2004 | Henley et al. | |
| 6,804,502 B2 | 10/2004 | Burgener et al. | |
| 6,898,778 B2 | 5/2005 | Kawanaka | |
| 6,908,832 B2 | 6/2005 | Farrens et al. | |
| 6,924,673 B2 * | 8/2005 | Tanishima | 327/108 |
| 6,958,519 B2 * | 10/2005 | Gonzalez et al. | 257/402 |
| 6,969,668 B1 | 11/2005 | Kang et al. | |
| 6,978,437 B1 | 12/2005 | Rittman et al. | |
| 6,989,706 B2 * | 1/2006 | Sekigawa et al. | 327/434 |
| 7,056,808 B2 | 6/2006 | Henley et al. | |
| 7,057,472 B2 | 6/2006 | Fukamachi et al. | |
| 7,058,922 B2 | 6/2006 | Kawanaka | |
| 7,123,898 B2 | 10/2006 | Burgener et al. | |
| 7,138,846 B2 | 11/2006 | Suwa et al. | |
| 7,158,067 B2 * | 1/2007 | Lauritzen et al. | 341/155 |
| 7,404,157 B2 | 7/2008 | Tanabe | |
| 7,460,852 B2 | 12/2008 | Burgener et al. | |
| 7,616,482 B2 | 11/2009 | Prall | |
| 7,796,969 B2 | 9/2010 | Kelly et al. | |
| 7,860,499 B2 | 12/2010 | Burgener et al. | |
| 7,863,691 B2 | 1/2011 | Wagner, Jr. et al. | |
| 7,890,891 B2 | 2/2011 | Stuber et al. | |
| 7,910,993 B2 | 3/2011 | Brindle et al. | |
| 8,129,787 B2 | 3/2012 | Brindle et al. | |
| 8,159,283 B2 | 4/2012 | Sugiyama | |
| 2001/0015461 A1 | 8/2001 | Ebina | |
| 2001/0045602 A1 | 11/2001 | Maeda et al. | |
| 2002/0195623 A1 | 12/2002 | Horiuchi | |
| 2003/0002452 A1 | 1/2003 | Sahota | |
| 2003/0205760 A1 | 11/2003 | Kawanaka et al. | |
| 2004/0080364 A1 | 4/2004 | Sander et al. | |
| 2005/0167751 A1 | 8/2005 | Nakajima et al. | |
| 2007/0023833 A1 | 2/2007 | Okhonin et al. | |
| 2008/0073719 A1 | 3/2008 | Fazan et al. | |
| 2008/0076371 A1 | 3/2008 | Dribinsky et al. | |
| 2008/0303080 A1 | 12/2008 | Bhattacharyya | |
| 2009/0029511 A1 | 1/2009 | Wu | |
| 2011/0227637 A1 | 9/2011 | Stuber et al. | |
| 2012/0169398 A1 | 7/2012 | Brindle et al. | |
| 2012/0267719 A1 | 10/2012 | Brindle et al. | |
| 2014/0009214 A1 * | 1/2014 | Altunkilic et al. | 327/427 |

FOREIGN PATENT DOCUMENTS

| | | |
|---|---|---|
| EP | 1006584 | 6/2000 |
| EP | 1451890 | 2/2011 |
| JP | 5575348 | 6/1980 |
| JP | 01254014 | 10/1989 |
| JP | 02161769 | 6/1990 |
| JP | 04183008 | 6/1992 |
| JP | 06334506 | 12/1994 |
| JP | 08148949 | 6/1996 |
| JP | 08307305 | 11/1996 |
| JP | 09284114 | 10/1997 |
| JP | 10242829 | 9/1998 |
| JP | 11136111 | 5/1999 |
| JP | 2003060451 | 2/2003 |
| JP | 3408762 | 5/2003 |
| JP | 2003189248 | 7/2003 |
| JP | 2004515937 | 5/2004 |
| WO | 9523460 | 8/1995 |
| WO | 0227920 | 4/2002 |
| WO | 2007008934 | 1/2007 |
| WO | 2007035610 | 3/2007 |

OTHER PUBLICATIONS

Bolam, R. et al., "Reliability Issues for Silicon-on-Insulator," Electron Devices Meeting Technical Digest, 2000, pp. 131-134.

Burgener, et al.; "CMOS SOS Switches Offer Useful Features, High Integration;" Microwaves & RF; 107-118; Aug. 2001.

Caverly, R. et al., "A Silicon CMOS Monolithic RF and Microwave Switching Element," 27th European Microwave Conference, Sep. 1997, pp. 1046-1051.

Caverly; "Linear and Nonlinear Characteristics of the Silicon CMOS Monolithic 50-Ω Microwave and RF Control Element;" IEEE. vol. 34; No. 1; 124-126; Jan. 1999.

Celler, et al.; "Smart Cut—A guide to the technology, the process, the products;" http://www.soitec.com/pdf/SmartCut_WP.pdf; Jul. 2003.

Chao, et al.; "High-Voltage and High-Temperature Applications of DTMOS with Reverse Schottky Barrier on Substrate Conctacts;" IEEE Electron Device Letters; vol. 25; No. 2; Feb. 2004; pp. 86-88.

Chung, I. et al., "SOI MOSFET Structure with a Junction-Type Body Contact for Suppression of Pass Gate Leakage," IEEE Transactions on Electron Devices, Jul. 2001, pp. 1360-1365, vol. 48, No. 7.

Dean; "Transistors, Theory and Circuitry." McGraw-Hill Publ. Co. Ltdl; 90-93; 1964.

Drake, et al.; "Dynamic-Threshold Logic for Low-Power VLSI Design." http://www.research.ibm.com/acas/projects/01drake.pdf; 2003.

Edwards, et al.; "The Effect of Body Contact Series Resistance on SOI CMOS Amplifier Stages;" IEEE Transactions on Electron Devices; vol. 44; No. 12; Dec. 1997; pp. 2290-2294.

Hameau, F. et al., "Radio-Frequency Circuits Integration Using CMOS SOI 0.25μm Technology," 2002 RF IC Design Workshop Europe, Mar. 19-22, 2002, 6 pages.

Hess et al.; "Transformerless Capacitive Coupling of Gate Signals for Series Operation of Power MOS Devices;" IEEE; vol. 15; No. 5; Sep. 2000.

Hirano, Y. et al., "Impact of Actively Body-bias Controlled (ABC) SOI SRAM by using Direct Body Contact Technology for Low-Voltage Application," Electron Devices Meeting Technical Digest, 2003, pp. 2.4.1-2.4.4.

Hu, C. et al., "A Unified Gate Oxide Reliability Model," IEEE 37th Annual International Reliability Physics Symposium, 1999, pp. 47-51.

Huang et al.; "A 0.5-μm CMOS T/R Switch for 900-MHz Wireless Applications;" IEEE Journal of Solid-State Circuits; vol. 36; No. 3; Mar. 2001.

Iyama, et al.; "L-Band SPDT Switch Using Si-MOSFET;" The Institute of Electronics, Information and Communication Engineers (IEICE); 636-643; 1996.

Johnson, et al.; "Advanced Thin-Film Silicon-on-Sapphire Technology: Microwave Circuit Applications," IEEE; vol. 45; No. 5; May 1998.

Kuang, J. et al., "A floating-body charge monitoring technique for partially depleted SOI technology," Int. J. Electronics, Nov. 2004, pp. 625-637, vol. 91, No. 11.

Kuang, J. et al., "SRAM Bitline Circuits on PD SOI: Advantages and Concerns," IEEE Journal of Solid-State Circuits, Jun. 1997, pp. 837-844, vol. 32, No. 6.

Kuo, et al.; "Low-Voltage SOI CMOS VLSI Devices and Circuits;" Wiley Interscience, New York, XP001090589, pp. 57-60 and pp. 349-354; 2001.

(56) References Cited

OTHER PUBLICATIONS

Lauterbach, et al.; "Charge Sharing Concept and New Clocking Scheme for Power Efficiency and Electromagnetic Emission Improvement of Boosted Charge Pumps;" IEEE Journal of Solid-State Circuits; vol. 35; No. 5; pp. 719-723; May 2000.

Lee et al., "Effects of Gate Structures on the RF Performance in PD SOI MOSFETs," IEEE Microwave and Wireless Components Letters, Apr. 2005, pp. 223-225, vol. 15, No. 4.

Lee, et al.; "Effect of Body Structure on Analog Performance of SOI NMOSFETs;" Proceedings; 1998 IEEE International SOI Conference; Oct. 5-8, 1998; pp. 61-62.

Lee, H. et al., "Analysis of body bias effect with PD-SOI for analog and RF applications," Solid State Electronics, 2002, pp. 1169-1176, vol. 46.

Lee, H. et al., "Harmonic Distortion due to Narrow Width Effects in Deep sub-micron SOI-CMOS Device for analog-RF applications," 2002 IEEE International SOI Conference, Oct. 2002, pp. 83-85.

Li, et al.; "A 15-GHz Integrated CMOS Switch with 21.5-dBm IP1dB and 1.8-dB Insertion Loss;" IEEE; 2004 Symposium on VLSI Circuits; Digest of Technical Papers; Jun. 17-19, 2004.

Maeda, et al.; "Substrate-Bias Effect and Source-Drain Breakdown Characteristics in Body-Tied Short-Channel SOI MOSFET's;" IEEE Transactions on Electron Devices; vol. 46; No. 1; Jan. 1999; pp. 151-158.

Makioka, S. et al., "Super Self-Aligned GaAs RF Switch IC with 0.25 dB Extremely Low Insertion Loss for Mobile Communication Systems," IEEE Transactions on Electron Devices, Aug. 2001, pp. 1510-1514, vol. 48, No. 8.

Megahed, M. et al, "Low Cost UTSI Technology for RF Wireless Applications," IEEE MTT-S Digest, 1998, pp. 981-984.

Orndorff, et al.; "CMOS/SOS/LSI Switching Regulator Control Device;" Solid-State Circuits Conf.; Digest of Technical Papers; IEEE International; vol. XXI; pp. 234-235; Feb. 1978.

Phillips Semiconductors; "Single Pole Double Throw (SPDT) Switch, RF Communication Products;" IC17 Handbook; 1997.

Rodgers, P. et al., "Silicon UTSi CMOS RFIC for CDMA Wireless Communications Systems," IEEE MTT-S Digest, 1999, pp. 485-488.

Rozeau, O. et al., "SOI Technologies for Low-Power Low-Voltage Radio-Frequency Applications," Analog Integrated Circuits and Signal Processing, 2000, pp. 93-114, vol. 25.

Sedra, A. et al., Microelectronic Circuits, 1998, Fourth Edition, University of Toronto Press, Oxford University Press, pp. 374-375.

Sleight, J. et al., "Transient Measurements of SOI Body Contact Effectiveness," IEEE Electron Device Letters, Dec. 1998, pp. 499-501, vol. 19, No. 12.

Suehle et al., "Low Electric Field Breakdown of Thin SiO2 Films Under Static and Dynamic Stress," IEEE Transactions on Electron Devices, May 1997, pp. 801-808, vol. 44, No. 5.

Tinella, et al.; "A High-Performance CMOS-SOI Antenna Switch for the 2.5 5-GHz Band;" IEEE Journal of Solid-State Circuits; vol. 38; No. 7; Jul. 2003.

Wei, et al.; "Measurement of Transient Effects in SOI DRAM/SRAM Access Transistors;" IEEE Electron Device Letters; vol. 17; No. 5; May 1996.

Workman, et al.; "A Comparative Analysis of the Dynamic Behavior of BTG/SOI MOSFET's and Circuits with Distributed Body Resistance;" IEEE Transactions on Electron Devices; vol. 45; No. 10; Oct. 1998; pp. 2138-2145.

Yamamoto, et al.; A 2.2-V Operation, 2.4-GHz Single-Chip GaAs MMIC Transceiver for Wireless Applications; IEEE; vol. 34; No. 4; Apr. 1999.

Notice of Allowance in U.S. Appl. No. 13/587,590 dated Jan. 7, 2014.

Office Action, issued in U.S. Appl. No. 13/587,590, dated Sep. 9, 2013, 12 pages.

\* cited by examiner

SWITCHING DEVICE WITH RESISTIVE DIVIDER

FIELD

Embodiments of the present disclosure relate generally to the field of circuits, and more particularly to switching devices utilizing a field-effect transistor (FET).

BACKGROUND

Radio frequency (RF) switching devices are used in many applications, for example wireless communication systems, to selectively pass an RF signal. For switching devices that include FETs, a bias voltage applied to a gate terminal may be required to bias the FET into an "on" state. In some cases, the applied voltage may cause the body of the FET to "float" at an indeterminate voltage.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Embodiments may include a switching device or switching circuit including a FET. The FET may comprise a body, source, drain and gate. The circuit may include a resistive divider coupled with the FET. In embodiments, the resistive divider may comprise a first resistor electrically coupled with the FET at a location electrically between the body of the FET and ground. The resistive divider may further comprise a second resistor coupled with the FET at a location electrically between the body and the gate of the FET. In some embodiments, a plurality of FETs and a plurality of resistive dividers may be used in the switching device or switching circuits.

Figure 1:
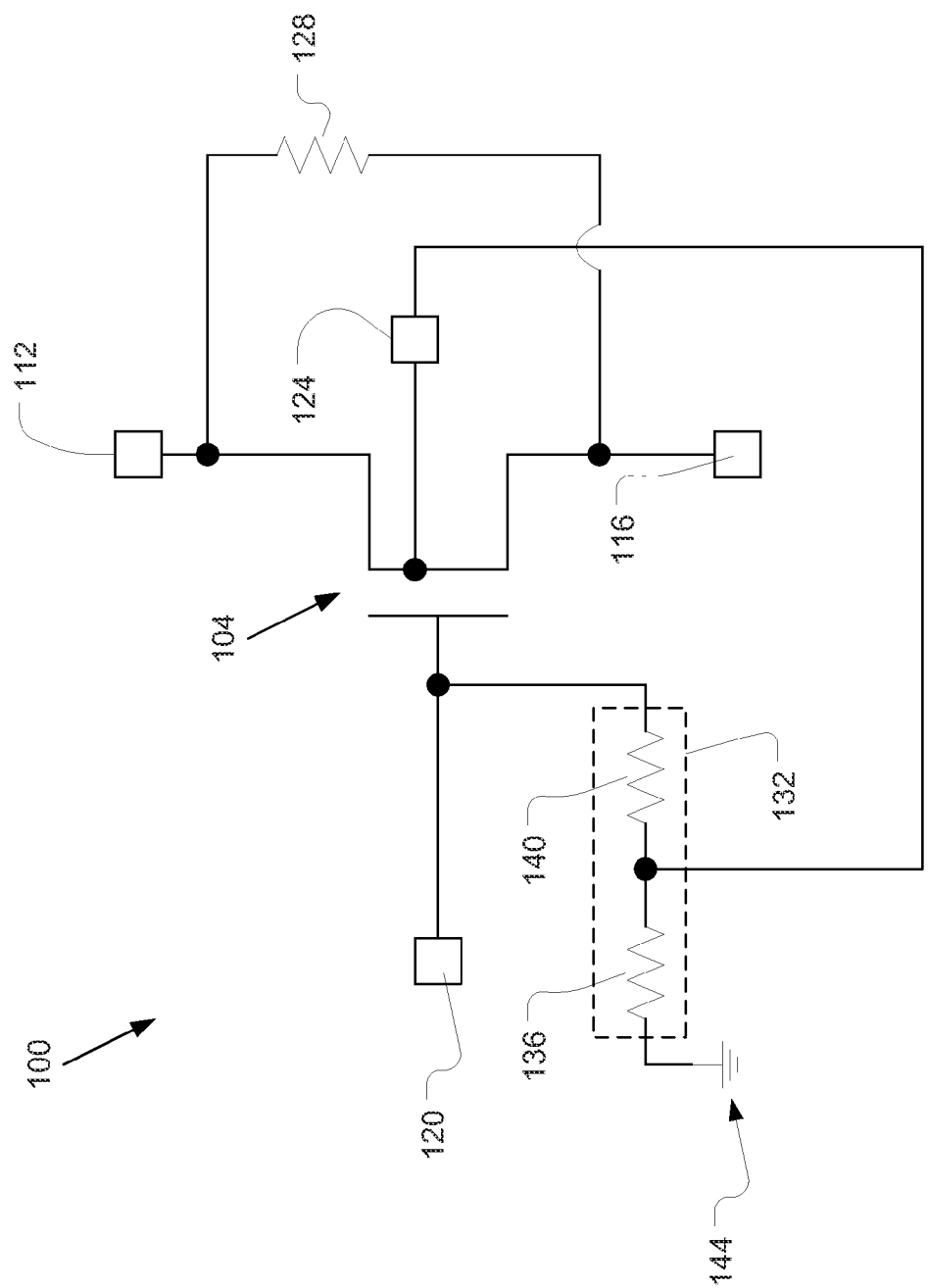
FIG. 1 illustrates a circuit diagram of a switching device in accordance with various embodiments.

FIG. 1 illustrates a switching circuit 100 in accordance with various embodiments. Switching circuit 100 (also referred to as circuit 100) may include a field-effect transistor (FET). The FET 104 may include a drain terminal 112, a source terminal 116, a gate terminal 120, and a body terminal 124 coupled with a respective drain, source, gate, and body of the FET, as described below with reference to FIG. 2. In some embodiments, the drain terminal 112 and the source terminal 116 may be electrically coupled with one another, as shown in FIG. 1. In some embodiments the electrical coupling between the drain terminal 112 and the source terminal 116 may include a resistor 128. In some embodiments, the FET 104 may be an enhancement mode FET. Additionally, or alternatively, the FET 104 may be a silicon on insulator (SOI) device and/or a bulk complementary metal-oxide-semiconductor (CMOS) device. In some embodiments the FET 104 may be a metal-oxide-semiconductor FET (MOSFET) while in other embodiments the FET 104 may be referred to as an insulated-gate FET (IGFET) or a metal-insulator-semiconductor FET (MISFET).

Various embodiments provide a biasing scheme to be used in biasing the voltage of the body of the FET 104. The biasing scheme is discussed herein with reference to an n-type enhancement mode FET. However, in other embodiments, the biasing scheme may be used and/or modified for use with another type of FET, such as a p-type FET.

In various embodiments, the FET 104 may selectively transition between an "off" state and an "on" state to facilitate switching of a transmission signal, hereafter referred to as a radio frequency (RF) signal. For example, the FET 104 may receive the RF signal at the source terminal 116 and pass the RF signal through the FET 104 and to the drain terminal 112 if the FET 104 is in the "on" state. The FET 104 may prevent the passage of the RF signal between the drain terminal 112 and the source terminal 116 if the FET 104 is in the "off" state.

The FET 104 may receive a control signal at the gate terminal 120 to transition the FET 104 between the "off" state and the "on" state. For example, a DC voltage of +2.5V with respect to the DC voltage of the drain terminal 112 and the source terminal 116 may be applied to the gate terminal 120. In some embodiments, the voltage may be applied by a decoder (not shown in FIG. 1). The +2.5V may have the effect of turning the FET 104 "on" by causing the resistance between the drain terminal 112 and the source terminal 116 to become very low so that an RF signal can pass between the drain terminal 112 and the source terminal 116.

Figure 2:
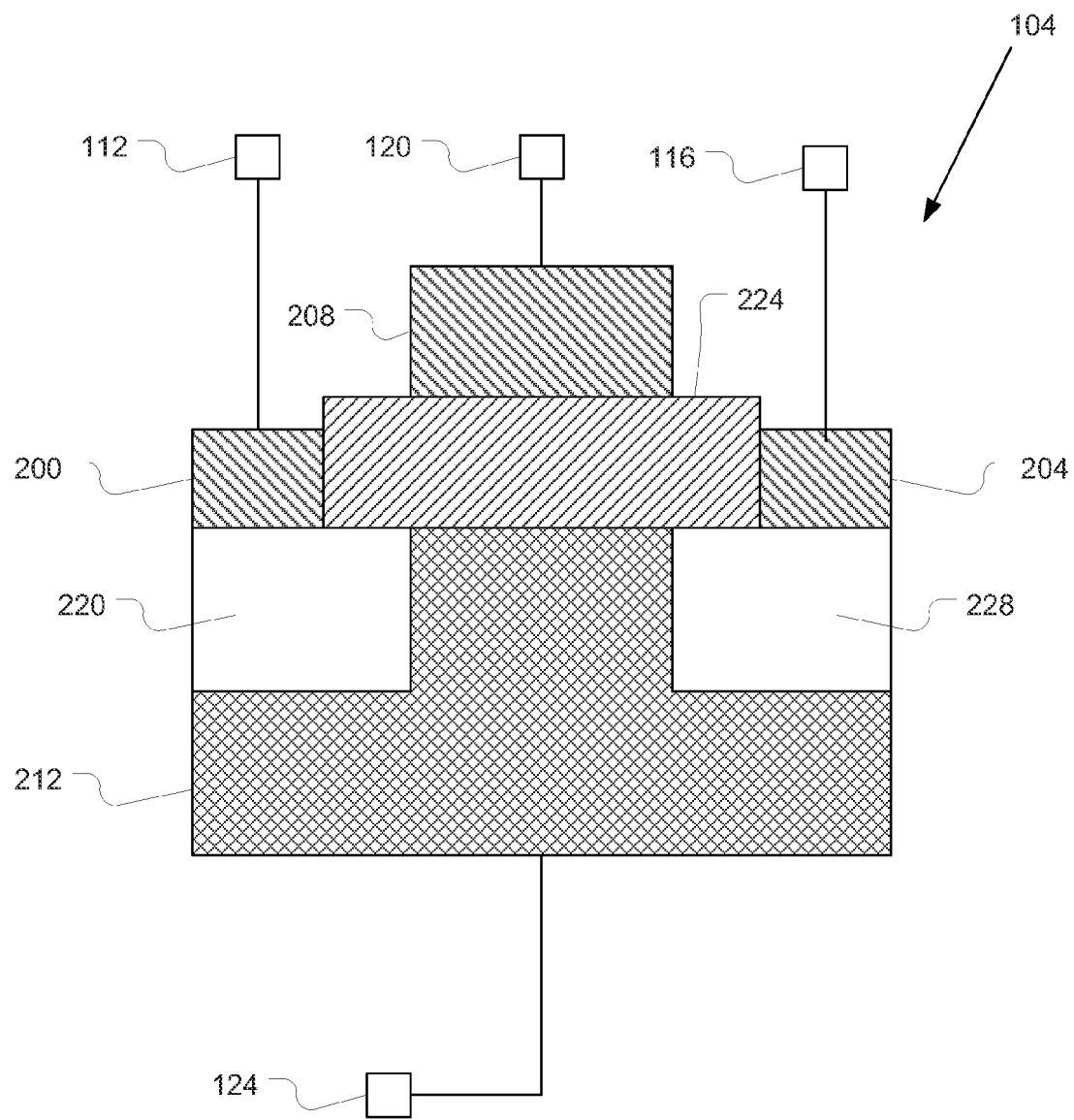
FIG. 2 illustrates an example of an n-type FET.

The application of a positive voltage to the gate terminal 120 may allow the RF signal to flow through the FET 104 because the FET 104 may generally comprise four parts as shown in the NMOS FET in FIG. 2. The FET 104 may be comprised of a drain 200 connected to the drain terminal 112, a source 204 connected to the source terminal 116, and a gate 208 connected to the gate terminal 120. In embodiments, the drain 200, the source 204, and the gate 208 may all be comprised of a metal or conductive material, for example aluminum or copper. In embodiments the drain 200, source 204, and gate 208 may be comprised of the same material, or different materials.

The FET 104 may further comprise a body 212 which is connected to the body terminal 124. The FET 104 may further comprise an n-type drain portion 220 positioned between the drain 200 and the body 212, and an n-type source portion 228 positioned between the source 204 and the body 212, as will be described in further detail below.

As used herein, "terminal" will generally be referred to as the element of the FET 104 where the FET 104 connects to another element in a circuit. In some embodiments the drain 200 and the drain terminal 112 may be considered to be the same element, for example the FET 104 may connect to another element in a circuit via a direct connection between the drain 200 and the element in the circuit. In other embodiments the drain terminal 112 may be a terminal, for example a conductive lead, which is electrically coupled with the drain 200. For example, in these other embodiments, the FET 104 may connect with another element in the circuit via the drain terminal 112 which may be a metallic lead such as a copper or other conductive lead, which in turn may be coupled with the drain 200. Similarly, the source 204 and source terminal 116 may be the same as one another, or electrically coupled with one another, as described above with respect to the drain 200 and drain terminal 112. Similarly the gate 208 and the gate terminal 120 may be the same as one another, or electrically coupled with one another. Finally, the body 212 and the body terminal 124 may be the same as one another or coupled with one another. In some embodiments, the body terminal 124 may be directly coupled with the source terminal 116. As used herein, the names given to the elements are for the purpose of distinguishing one element of the FET 104 from another, and different embodiments may use different names, for example calling the n-type drain portion 220 the "drain" or the n-type source portion 228 the "source" of the FET 104.

As an example of use of the FET 104, a DC voltage will be discussed as being applied to the gate terminal 120, which in turn may cause the gate 208 to gain the specified voltage. However, in some embodiments the DC voltage may be applied directly to the gate 208. As another example, the RF signal may be received at either the source 204 or the source terminal 116, and passed through the FET 104 when the FET 104 is "on," to the drain 200 or drain terminal 112.

The body 212 may be made up of a p-type material, for example a Group IV element such as silicon or germanium doped with Group III elements such as boron or aluminum. The n-type drain and source portions 220, 228, may be comprised of a Group IV element such as silicon or germanium doped with a Group V element such as arsenic or phosphorous. The n-type drain and source portions 220, 228 may be separated from one another by the body 212. In general, a p-type material is lacking electrons and is said to have "electron holes." An n-type material has extra electrons which may be able to move as an electric current within or out of the n-type material, and may therefore be said to have "mobile electrons."

As noted above, the gate 208 of the FET 104 may be comprised of a conductive metal such as copper or aluminum. In other embodiments, the gate 208 may be comprised of tantalum, tungsten or tantalum nitride. In other embodiments, the gate 208 of the FET 104 may be comprised of a polysilicon material. The drain 200, source 204, gate 208, and body 212 may all be separated from one another by a dielectric 224, for example silicon dioxide, silicon oxynitride, or some other high-k dielectric that prevents the flow of electrons between the drain 200 and the source 204.

An electrostatic field may be created between the gate 208 and the rest of the FET 104 when the gate 208 gains a positive voltage due to a positive voltage applied to the gate terminal 120. The positive gate voltage may repel the electron holes in the p-type material of the body 212 while attracting the free electrons in the p-type material of the body 212. At the same time, the positive gate voltage may attract the mobile electrons in the n-type drain and source portions 220, 228. When the positive voltage of the gate 208 becomes high enough compared to the DC voltage of the drain 200 and the source 204, a voltage known as a "threshold voltage," the repulsion in the p-type material of the body 212, and the attraction of the free electrons in the body 212 and the mobile electrons in the n-type drain and source portions 220, 228, may create an electric channel. The electric channel is sometimes called an "inversion layer," and may be between the n-type drain and source portions 220, 228 and directly under the dielectric 224. In other words, the electric channel between the n-type drain and source portions 220, 228 may be directly between the body 212 and the dielectric 224. In some embodiments, increasing the voltage applied to the gate terminal 120 may increase the voltage of the gate 208, which increases the size of the electrostatic field. The increase in the electrostatic field may increase the size of the electric channel, and thus the amount of current that can be passed between the drain 200 and the source 204.

Similarly, a voltage of −2.5V may be applied by the decoder to the gate terminal 120. The −2.5V may cause the resistance of the FET 104 as measured between the drain terminal 112 and the source terminal 116 to become very high so that no signal can pass between the drain terminal 112 and the source terminal 116. The resistance becomes high because the negative voltage at the gate terminal 120 causes the gate 208 to gain a negative voltage, thereby creating a negative electrostatic field. The negative electrostatic field simultaneously attracts the electron holes in the p-type body 212 and repels the mobile electrons in the n-type drain and source portions 220, 228, thereby negating the possibility of transferring electrons between the source 204 and the drain 200. In other embodiments where a PMOS FET is used instead of the NMOS FET 104, the body 212 may be an n-type material and the drain and source portions 220, 228 may be p-type material.

In some embodiments, it may be desirable for the voltage of the body 212 to "follow," or have a similar voltage to, the voltage of the gate 208. This may be desirable because, for example, if the body 212 gains a positive voltage when a positive voltage is applied to the gate 208 or the gate terminal 120, then the electric channel between the drain 200 and the source 204 may be enhanced, thereby increasing the efficiency of the FET 104. Similarly, if the body 212 gains a negative voltage when a negative voltage is applied to the gate 208 or the gate terminal 120, then the repulsion of the n-type drain and source portions 220, 228 may be increased which will increase the resistance of the FET 104 and reduce any signal leakage.

In some cases, an active element such as a PMOS FET has been used as a diode, and coupled with the FET 104 between the body terminal 124 and the gate terminal 120. When the voltage at the gate terminal 120 becomes negative, for example −2.5V, the diode may cause the voltage of the body 212 to become negative, and in many embodiments the voltage of the body 212 may be very close to the voltage at the gate terminal 120. For example, if the voltage at the gate terminal 120 is −2.5V, the voltage of the body 212 may be −2.3V. This process may be called "bootstrapping." In some embodiments it may be desirable for the voltage of the body 212 to stay close to the voltage of the gate terminal 120, and in other embodiments it may be desirable for the voltage of the body 212 to only vary a small amount, for example a few tenths of a volt, when a voltage of +2.5V or −2.5V is applied to the gate terminal 120.

However, when a PMOS FET is used as a diode, the voltage of the body 212 may become an arbitrary value if the voltage of the gate 208 becomes positive. In this case is may be said that the voltage of the body 212 is "floating." The floating voltage of the body 212 may be problematic, because it may make circuit design difficult if the exact voltage and current of the body 212 is not known.

Specifically, as described above, the RF signal transfer between the source 204 and the drain 200 may be enhanced or decreased by a respective increase or decrease of the voltage of the body 212. As noted, if the voltage of the body 212 is increased when the voltage of the gate 208 is positive, then the channel between the n-type drain and source portions 220, 228 may be larger and increased current can flow through the FET 104. However, if it is unknown what the voltage of the body 212 is, then it may be difficult to predict what the RF signal current flowing through the FET 104 may be. Additionally, if the voltage of the body 212 becomes too high, then the current of the RF signal may become very high if it is floating and not controlled. This high current may cause the FET 104 to heat up, which may cause damage to the FET 104, the circuit using the FET 104, or even the device using the FET 104.

In some embodiments, a resistive divider 132 may be used in place of the PMOS FET. The resistive divider 132 may include a first resistor 136 and a second resistor 140. The first resistor 136 may be placed between the body terminal 124 and ground 144. The second resistor 140 may be placed between the body terminal 124 and the gate terminal 120.

The use of the resistive divider 132 as shown in FIG. 1 may offer significant benefits over the above described use of the diode, for example the active PMOS FET. Specifically, the resistive divider 132 may allow the voltage at the body 212 to follow the voltage of the gate 208 at a known voltage regardless of whether the gate 208 has a positive voltage or a negative voltage applied to it by the decoder. In other words, the resistive divider 132 may eliminate the "floating" voltage of the body 212 if the voltage of the gate 208 is positive, and instead the voltage of the body 212 may be a predicted value.

Additionally, the PMOS FET diode may require additional power inputs to turn the PMOS FET "on" or "off." A circuit utilizing the resistive divider 132 may be passive and therefore not require the additional power inputs, because the PMOS FET is not present. The reduction in power inputs may simplify circuit design and reduce costs of a circuit utilizing the FET 104.

The resistances of the first resistor 136 and the second resistor 140 may be selected specifically with respect to one or more of the FET 104, the voltage at the gate terminal 120, the voltage at the drain terminal 112, the voltage at the source terminal 116, and/or how closely the voltage of the body 212 is desired to follow the voltage of the gate 208. As an example, if it is desired for the voltage of the body 212 to be +1.0 V when the voltage of the gate 208 is +2.5V, then the resistance of one or both the first resistor 136 and the second resistor 140 may be different than if it was desired for the voltage of the body 212 to be +2.3V when the of the gate 208 is +2.5V. In some embodiments, the voltage of the body 212 when the gate 208 is at a given voltage may be based at least in part on the ratio of the resistance of the first resistor 136 to the second resistor 140.

Figure 3:
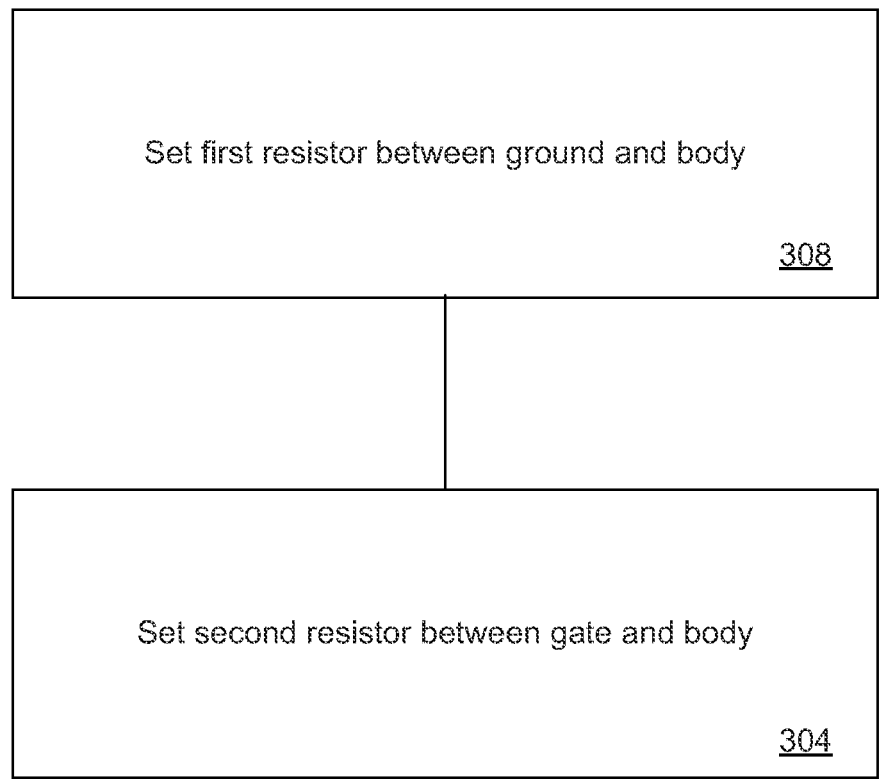
FIG. 3 illustrates a flowchart of a method for controlling the voltage of a body of a switching device in accordance with various embodiments.

FIG. 3 shows a flowchart of a method 300 of biasing the body of a FET (e.g., body 212 of FET 104) when a voltage is applied to the gate terminal, e.g. gate terminal 120, in accordance with various embodiments. Specifically, a first resistor, for example first resistor 136, may be coupled with the FET between the body terminal 124 and ground 144 at 308. Next, a second resistor, for example second resistor 140, may be electrically coupled with the FET 104 between the gate terminal 120 and the body terminal 124 at 304.

By appropriately selecting the resistance of the first resistor 136 and the second resistor 140, the voltage of the body 212 may be biased so that it follows the voltage of the gate 208 or gate terminal 120. In other words, the body 212 may have a known positive voltage when a positive voltage is applied to the gate terminal 120. Conversely, the body 212 may have a known negative voltage when a negative voltage is applied to the gate terminal 120. In some embodiments, the voltage of the body 212, as compared to the gate 208, may be based at least in part on the ratio of the resistances of the first resistor 136 and the second resistor 140.

In some embodiments, the FET 104 and the resistive divider 132 may be together referred to as a unit cell. In some embodiments the unit cell may further include the decoder coupled with the gate terminal 120 of the FET 104. In some embodiments, a switch may include a plurality of FETs and resistive dividers, i.e. a plurality of unit cells. In these embodiments, the plurality of unit cells may be in series with one another. It may be desirable to couple a plurality of unit cells in series because, as noted above, when the FET 104 is turned "off" a large resistance is created between the source terminal 116 and the drain terminal 112. If the current of the RF signal is very large, then the FET 104 may be damaged. By coupling a plurality of FETs in series, the load created by the large RF signal may be distributed so that each FET is only bearing a portion of the load. In this manner, the lifetime of the FETs may be extended.

Figure 4:
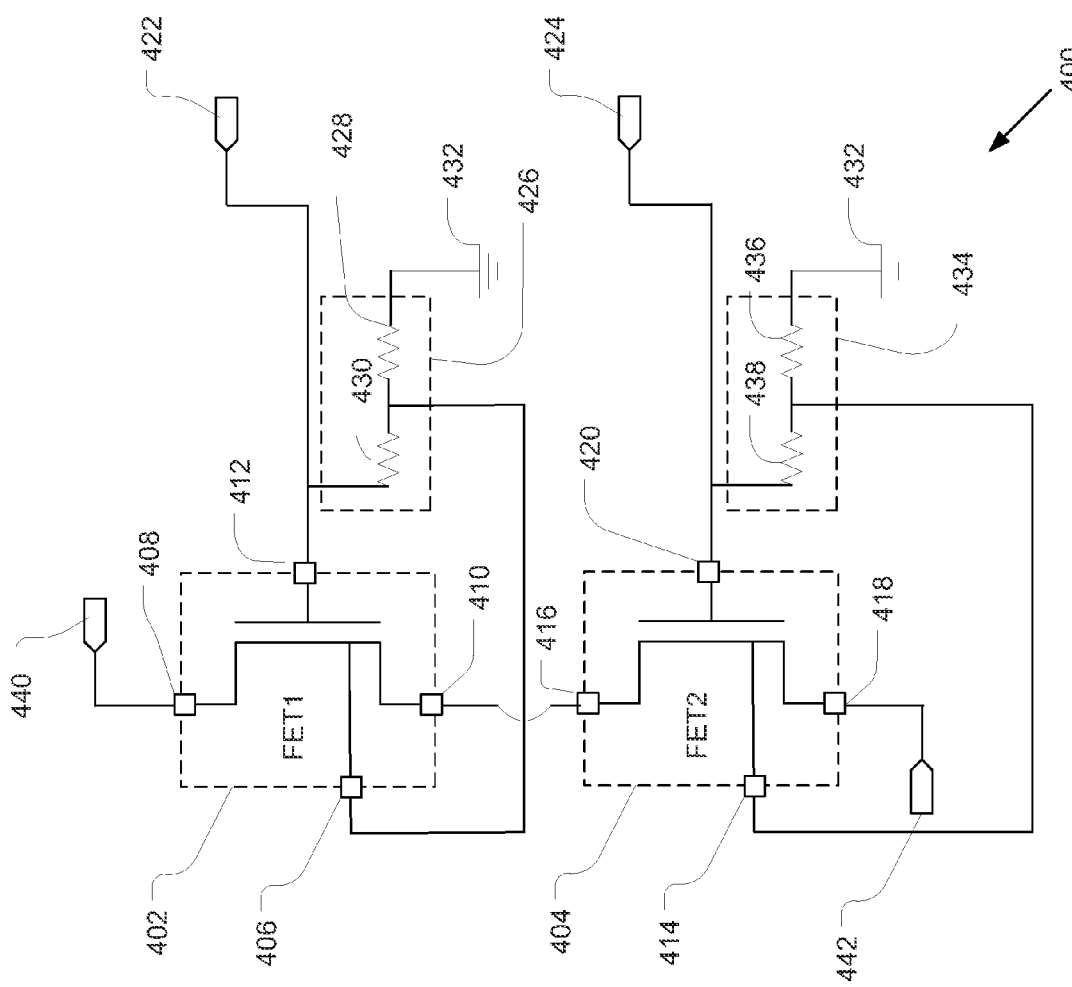
FIG. 4 illustrates a circuit diagram of a switching device in accordance with various embodiments.

FIG. 4 depicts an example of a switching circuit 400 with a plurality of unit cells that are connected in series with one another. Other embodiments may have additional unit cells. In some embodiments the switched circuit 400 may be in either series or shunt of the signal path. Specifically, FIG. 4 depicts an embodiment of a switching circuit 400 with two FETs, a first FET 402 and a second FET 404. The first FET 402 may include a body terminal 406, a drain terminal 408, a source terminal 410, and a gate terminal 412 respectively coupled with a body, drain, source, and gate (not shown) of the first FET 402. The second FET 404 may similarly include a body terminal 414, a drain terminal 416, a source terminal 418, and a gate terminal 420 respectively coupled with a body, drain, source, and gate (not shown) of the second FET 404. The gate terminal 412 of the first FET 402 may be electrically coupled with a first DC power supply 422 configured to provide a DC voltage to the gate terminal 412, and the gate terminal 420 of the second FET 404 may be coupled with a second DC power supply 424 configured to provide a DC voltage to the gate terminal 420. In some embodiments, the first and second DC power supplies 422, 424 may be the same DC power supply. In embodiments, the first and second DC power supplies 422, 424 may also be referred to as "decoders."

As described above with respect to FIG. 1, the first FET 402 may be coupled with a resistive divider 426 comprising a first resistor 428 electrically coupled between the body terminal 406 and ground 432, and a second resistor 430 electrically coupled between the body terminal 406 and the gate terminal 412. Similarly, the second FET 404 may be coupled with a resistive divider 434 comprising a first resistor 436 electrically coupled between the body terminal 414 and ground 432, and a second resistor 438 electrically coupled between the body terminal 414 and the gate terminal 420.

In some embodiments of the switching circuit 400, the two unit cells may be coupled in series with one another. In these embodiments, the drain terminal 416 of the second FET 404 may be coupled with the source terminal 410 of the first FET 402. Further, the drain terminal 408 of the first FET 402 may be coupled with an $RF_{in}$ terminal 440, and the source terminal 418 of the second FET 404 may be coupled with an $RF_{out}$ terminal 442. In this embodiment, the $RF_{in}$ terminal 440 may be the source of the RF signal being passed through the switching circuit 400 when the first and second FETs 402, 404 of the switching circuit 400 are "on." The $RF_{out}$ terminal 442 may be where the RF signal exits the switch. The $RF_{in}$ and $RF_{out}$ terminals 440, 442 and signal flow are described in greater detail below with respect to FIG. 5.

In some embodiments the $RF_{out}$ terminal 442 may be connected to ground while the $RF_{in}$ terminal 440 is connected to a power supply. As noted above, the configurations described are with respect to n-type or NMOS FETS; however p-type or PMOS FETs may also be used in the switching circuit 400 with slight modifications to the configuration of the switching circuit 400. In other embodiments, the $RF_{in}$ terminal 440 and the $RF_{out}$ terminal 442 may be connected to other elements of a circuit. The connections of the $RF_{in}$ terminal 440 and the $RF_{out}$ terminal 442 may be dependent on the application that the switching circuit 400 is used in.

In some embodiments, the resistance of the first resistor 428 of the first FET 402 may be the same as the resistance of the first resistor 436 of the second FET 404. In other embodiments, the resistance of the two first resistors 428, 436 may be different. Similarly, the resistance of the second resistors 430, 438 may be the same or different, dependent on the type, application, or use of the switching circuit 400 or the FETs 402, 404.

Figure 5:
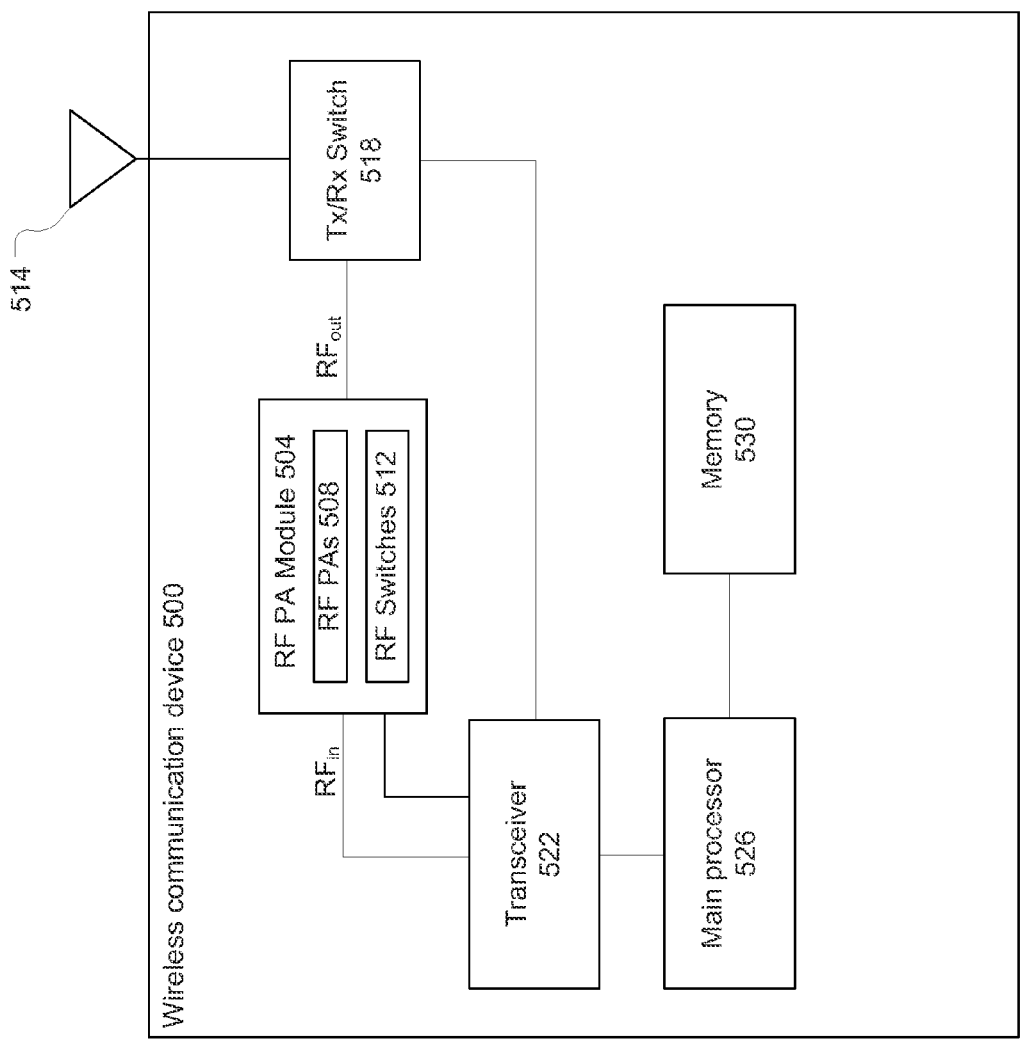
FIG. 5 is a block diagram of an exemplary wireless communication device in accordance with various embodiments.

A block diagram of an exemplary wireless communication device 500 is illustrated in FIG. 5 in accordance with some embodiments. Wireless communication device 500 may have an RF power amplifier (PA) module 504 including one or more RF PAs 508. RF PA module 504 may further include one or more RF switches 512 coupled with one or more of the RF PAs 508. The RF switches 512 may be similar to and/or include switching circuits 100, and/or 400.

In addition to the RF PA module 504, the wireless communication device 500 may have an antenna structure 514, a Tx/Rx switch 518, a transceiver 522, a main processor 526, and a memory 530 coupled with each other at least as shown. While the wireless communication device 500 is shown with transmitting and receiving capabilities, other embodiments may include devices with only transmitting or only receiving capabilities. While RF switches 512 are shown as included in RF PA module 504, in other embodiments, RF switches 512 may be included in other components of the wireless communication device 500, such as Tx/Rx switch 518 and/or transceiver 522, in addition to or instead of RF PA module 504. In other embodiments, the RF switches 512 may be components of an RF front end, an RF transmitter, or a power convertor.

In various embodiments, the wireless communication device 500 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 526 may execute a basic operating system program, stored in the memory 530, in order to control the overall operation of the wireless communication device 500. For example, the main processor 526 may control the reception of signals and the transmission of signals by transceiver 522. The main processor 526 may be capable of executing other processes and programs resident in the memory 530 and may move data into or out of memory 530, as desired by an executing process.

The transceiver 522 may receive outgoing data (e.g., voice data, web data, e-mail, signaling data, etc.) from the main processor 526, may generate the $RF_{in}$ signal(s) to represent the outgoing data, and provide the $RF_{in}$ signal(s) to the RF PA module 504. The transceiver 522 may also control the RF PA module 504 to operate in selected bands and in either full-power or backoff-power modes. In some embodiments, the transceiver 522 may generate the $RF_{in}$ signal(s) using OFDM modulation.

The RF PA module 504 may amplify the $RF_{in}$ signal(s) to provide $RF_{out}$ signal(s) as described herein. The $RF_{out}$ signal(s) may be forwarded to the Tx/Rx switch 518 and then to the antenna structure 514 for an over-the-air (OTA) transmission. In some embodiments, Tx/Rx switch 518 may include a duplexer. In a similar manner, the transceiver 522 may receive an incoming OTA signal from the antenna structure 514 through the Tx/Rx switch 518. The transceiver 522 may process and send the incoming signal to the main processor 526 for further processing.

The one or more RF switches 512 may be used to selectively pass RF signal(s) (e.g., $RF_{in}$ signal(s) and/or $RF_{out}$ signal(s)) to, from, and/or within components of wireless communication device 500.

In various embodiments, the antenna structure 514 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 500 is given by way of example and that, for simplicity and clarity, only so much of the construction and operation of the wireless communication device 500 as is necessary for an understanding of the embodiments is shown and described. Various embodiments contemplate any suitable component or combination of components performing any suitable tasks in association with wireless communication device 500, according to particular needs. Moreover, it is understood that the wireless communication device 500 should not be construed to limit the types of devices in which embodiments may be implemented.

Methods and apparatuses are provided herein. In certain embodiments, a circuit may comprise a MOSFET including a source terminal, a gate terminal, a drain terminal, and a body terminal. The circuit may further comprise a resistive divider having a first resistor and a second resistor and coupled with and between the gate terminal and the body terminal. In one embodiment, the MOSFET may be an n-type MOSFET. In one embodiment, the MOSFET may be a p-type MOSFET. In some embodiments, the first resistor may comprise a first connection coupled with a ground, and a second connection coupled with the body terminal. In some embodiments, the second resistor may comprise a first connection coupled with the body terminal and a second connection coupled with the gate terminal. In some embodiments, the resistive divider may be configured to bias a voltage of the body terminal between a voltage of the gate terminal and a ground voltage when the voltage of the gate terminal is not equal to the ground voltage. In other embodiments, the voltage of the body terminal may be a predetermined voltage based at least in part on a resistance of the first resistor and a resistance of the second resistor. In one embodiment the voltage of the gate terminal may be positive with respect to the ground voltage. In one embodiment the voltage of the gate terminal may be negative with respect to the ground voltage. In one embodiment, the circuit may further comprise a switch including the MOSFET and the resistive divider, and a RF front end, an RF transmitter, or a power convertor including the switch.

In one embodiment, a circuit may comprise a power source configured to provide a power voltage, a ground source configured to provide a ground voltage, and one or more unit cells coupled with the power source and the ground source. A unit cell of the one or more unit cells may include a MOSFET having a body terminal, a gate terminal, a source terminal, and a drain terminal, and a resistive divider comprising a first resistor and a second resistor, the resistive divider configured to bias a voltage of the body terminal between a voltage of the gate terminal and a ground voltage when the voltage of the gate terminal is not equal to the ground terminal. In some embodiments, the MOSFET may be a p-type MOSFET. In some embodiments the MOSFET may be an n-type MOSFET. In some embodiments, the first resistor may comprise a first connection coupled with the ground source, and a second connection coupled with the body terminal. In some embodiments, the second resistor may comprise a first connection coupled with the body terminal and a second connection coupled with the gate terminal. In some embodiments, the resistive divider may be coupled with and between the gate terminal and the body terminal. In some embodiments, the voltage of the body terminal may be a predetermined voltage based at least in part on a resistance of the resistive divider. In some embodiments the voltage of the gate terminal may be positive with respect to the ground voltage. In some embodiments the voltage of the gate terminal may be negative with respect to the ground voltage.

Some embodiments may provide a method comprising coupling a MOSFET with a power source and a ground source. The MOSFET may comprise a drain terminal, a body terminal, a source terminal, and a gate terminal. The method may further comprise coupling the body terminal and the gate terminal of the MOSFET with the resistive divider such that the resistive divider is positioned between the body terminal and the gate terminal. The resistance of the first resistor and the resistance of the second resistor may be based at least in part on a desired voltage of the body terminal when the gate terminal is at a gate voltage that is not equal to a ground voltage of the ground source. In some embodiments the MOSFET may be an n-type MOSFET or a p-type MOSFET. In some embodiments, the method may further comprise coupling a first connection of the first resistor with the ground source, and coupling a second connection of the first resistor with the body terminal. In some embodiments, the method may further comprise coupling a first terminal of the second resistor with the gate terminal, and coupling a second terminal of the second resistor with the body terminal. In some embodiments the desired voltage of the body terminal may be between the gate voltage and the ground voltage. In some embodiments, the gate voltage may be positive with respect to the ground voltage. In some embodiments, the gate voltage may be negative with respect to the ground voltage.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
a metal-oxide-semiconductor field-effect transistor (MOSFET) including a source terminal, a gate terminal, a drain terminal, and a body terminal; and
a resistive divider having a first resistor and a second resistor, the resistive divider coupled with and between the gate terminal and the body terminal, and further coupled with a ground source and a DC voltage source;
wherein the DC voltage source is further coupled with the gate terminal and configured to provide a constant DC voltage to the gate terminal and the resistive divider; and
wherein the DC voltage of the gate terminal and a voltage of the body terminal are dependent on the constant DC voltage and a ground voltage of the ground source, and independent of a voltage of the source terminal and a voltage of the drain terminal.

2. The circuit of claim 1, wherein the MOSFET is an n-type MOSFET.

3. The circuit of claim 1, wherein the MOSFET is a p-type MOSFET.

4. The circuit of claim 1, wherein the first resistor comprises a first connection coupled with the ground source, and a second connection coupled with the body terminal.

5. The circuit of claim 4, wherein the second resistor comprises a first connection coupled with the body terminal and a second connection coupled with the gate terminal.

6. The circuit of claim 1, wherein the resistive divider is configured to bias the voltage of the body terminal between the DC voltage of the gate terminal and the ground voltage when the DC voltage of the gate terminal is not equal to the ground voltage.

7. The circuit of claim 6, wherein the voltage of the body terminal is a predetermined voltage based at least in part on a resistance of the first resistor and a resistance of the second resistor.

8. The circuit of claim 7, wherein the DC voltage of the gate terminal is positive with respect to the ground voltage.

9. The circuit of claim 7, wherein the DC voltage of the gate terminal is negative with respect to the ground voltage.

10. The circuit of claim 1, further comprising:
a switch including the MOSFET and the resistive divider; and
a radio frequency (RF) front end, an RF transmitter, or a power convertor including the switch.

11. A circuit comprising:
a DC power source configured to provide a constant DC voltage;

a ground source configured to provide a ground voltage; and one or more unit cells coupled with the DC power source and the ground source, a unit cell of the one or more unit cells including:
- a metal-oxide-semiconductor field-effect transistor (MOSFET) having a body terminal, a gate terminal coupled with the DC power source such that the DC power source is configured to provide the DC voltage to the gate terminal, a source terminal, and a drain terminal; and
- a resistive divider that does not include a capacitor, the resistive divider coupled with the DC power source such that the DC power source is configured to provide the DC voltage to the resistive divider, the resistive divider comprising a first resistor and a second resistor and configured to bias a voltage of the body terminal between the DC voltage and the ground voltage when the DC voltage is not equal to the ground voltage such that the voltage of the body terminal and the DC voltage of the gate terminal are dependent on the DC voltage and the ground voltage and independent of a voltage of the source terminal and the drain terminal.

12. The circuit of claim 11, wherein the MOSFET is a p-type MOSFET.

13. The circuit of claim 11, wherein the MOSFET is an n-type MOSFET.

14. The circuit of claim 11, wherein the first resistor comprises a first connection coupled with the ground source, and a second connection coupled with the body terminal.

15. The circuit of claim 11, wherein the second resistor comprises a first connection coupled with the body terminal and a second connection coupled with the gate terminal.

16. The circuit of claim 11, wherein the resistive divider is coupled with and between the gate terminal and the body terminal.

17. The circuit of claim 16, wherein the voltage of the body terminal is a predetermined voltage based at least in part on a resistance of the resistive divider.

18. The circuit of claim 17, wherein the DC voltage is positive with respect to the ground voltage.

19. The circuit of claim 17, wherein the DC voltage is negative with respect to the ground voltage.

20. A method comprising:
coupling a metal-oxide-semiconductor field-effect transistor (MOSFET) with a DC power source and a ground source, the MOSFET comprising a drain terminal, a body terminal, a source terminal, and a gate terminal;

coupling a first resistor directly to a second resistor to form a resistive divider; and coupling the body terminal and the gate terminal of the MOSFET with the resistive divider such that the resistive divider is positioned between the body terminal and the gate terminal such that a voltage at the body terminal and the gate terminal are dependent on a constant DC gate voltage provided by the DC power source and a ground voltage of the ground source, and independent of a voltage of the source terminal and the drain terminal;

wherein a resistance of the first resistor and a resistance of the second resistor, within the resistive divider, are based at least in part on a desired voltage of the body terminal when the gate terminal is at the constant DC gate voltage provided by the DC power source, wherein the DC gate voltage is not equal to the ground voltage of the ground source.

21. The method of claim 20, wherein the MOSFET is an n-type MOSFET.

22. The method of claim 20, wherein the MOSFET is a p-type MOSFET.

23. The method of claim 20, further comprising coupling a first connection of the first resistor with the ground source, and coupling a second connection of the first resistor with the body terminal.

24. The method of claim 20, further comprising coupling a first terminal of the second resistor with the gate terminal, and coupling a second terminal of the second resistor with the body terminal.

25. The method of claim 20, wherein the desired voltage of the body terminal is between the DC gate voltage and the ground voltage.

26. The method of claim 25, wherein the DC gate voltage is positive with respect to the ground voltage.

27. The method of claim 25, wherein the DC gate voltage is negative with respect to the ground voltage.

* * * * *